(12) United States Patent
Kim et al.

(10) Patent No.: US 7,346,982 B2
(45) Date of Patent: Mar. 25, 2008

(54) METHOD OF FABRICATING PRINTED CIRCUIT BOARD HAVING THIN CORE LAYER

(75) Inventors: Chong Ho Kim, Chungcheongbuk-do (KR); Dong Kuk Kim, Kyunggi-do (KR); Hyo Soo Lee, Daejeon (KR); Young Hwan Shin, Daejeon (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 249 days.

(21) Appl. No.: 11/086,642

(22) Filed: Mar. 22, 2005

(65) Prior Publication Data

US 2006/0121256 A1    Jun. 8, 2006

(30) Foreign Application Priority Data

Dec. 2, 2004    (KR)    .................... 10-2004-0100585

(51) Int. Cl.
*H05K 3/02* (2006.01)
(52) U.S. Cl. ..................... 29/847; 29/830; 29/851; 29/852; 156/248; 156/289; 174/255
(58) Field of Classification Search .............. 29/825, 29/831, 846, 847, 851–853; 174/250, 260–262, 174/255; 156/247, 248, 289; 257/778; 361/748
See application file for complete search history.

(56) References Cited

U.S. PATENT DOCUMENTS

| 5,495,665 | A | * | 3/1996 | Carpenter et al. | ............ 29/830 |
| 5,591,519 | A | * | 1/1997 | Caron et al. | ................. 174/260 |
| 6,580,036 | B2 | * | 6/2003 | Kim et al. | ................... 174/261 |
| 6,696,764 | B2 | * | 2/2004 | Honda | ......................... 257/778 |
| 7,189,302 | B2 | * | 3/2007 | Hwang et al. | .............. 156/289 |

FOREIGN PATENT DOCUMENTS

| JP | 2004-87701 | 3/2004 |
| JP | 2004-186265 | 7/2004 |
| JP | 2004-235323 | 8/2004 |
| KR | 10-2003-0046050 | 6/2003 |

* cited by examiner

*Primary Examiner*—Donghai D. Nguyen
(74) *Attorney, Agent, or Firm*—Darby & Darby, P.C.

(57) ABSTRACT

A method is directed towards fabricating a printed circuit board (PCB) having a thin core layer. In the method, a substrate, where a copper foil is formed on a release film and a prepreg, is employed as a base substrate and a core insulating layer is removed after the fabrication of the PCB, thereby reducing the thickness of the final product.

3 Claims, 10 Drawing Sheets

METHOD OF FABRICATING PRINTED CIRCUIT BOARD HAVING THIN CORE LAYER

INCORPORATION BY REFERENCE

The present application claims priority under 35 U.S.C. §119 to Korean Patent Application No. 10-2004-0100585 filed on Dec. 2, 2004. The content of the application is incorporated herein by reference in its entirety.

BACKGROUND OF THE INVENTION

1. Field of the Invention

The present invention relates to a method of fabricating a printed circuit board (PCB). More particularly, the present invention pertains to a method of fabricating a PCB, in which a substrate, where a copper foil is formed on a release film and a prepreg, is employed as a base substrate and a core insulating layer is removed after the fabrication of the PCB, thereby reducing the thickness of the final product.

2. Description of the Prior Art

In accordance with the trend of miniaturization and slimming of electronic goods, a size of a package tends to be reduced. In this regard, the total size of the package depends on the size of a substrate used in the package.

FIGS. 1a to 1m are sectional views illustrating the stepwise fabrication of a six-layered PCB in the conventional build-up manner. In the specification of the present invention, the term "build-up manner" means a process which comprises forming internal layers and layering external layers one by one on the internal layers.

FIG. 1a is a sectional view of an unprocessed copper clad laminate (CCL) 101. Copper foils 102 are applied onto an insulating layer 103. Generally, the copper clad laminate acts as a substrate of a PCB, and means a thin laminate consisting of the insulating layer onto which copper is thinly applied.

The copper clad laminate is classified into a glass/epoxy CCL, a heat-resistant resin CCL, a paper/phenol CCL, a high-frequency CCL, a flexible CCL (polyimide film), a complex CCL, and the like, in accordance with its use. Of them, the glass/epoxy CCL is most frequently used to fabricate double-sided PCBs and multilayer PCBs.

The glass/epoxy CCL consists of a reinforcing base substance in which an epoxy resin (combination of a resin and a curing agent) is penetrated into a glass fiber, and a copper foil. The glass/epoxy CCL is graded FR-1 to FR-5, as prescribed by the National Electrical Manufacturers Association (NEMA), in accordance with the kind of reinforcing base substance and heat resistance. Traditionally, the FR-4 grade of glass/epoxy CCL is most frequently used, but recently, the demand for the FR-5 grade of glass/epoxy CCL, which has improved glass transition temperature ($T_g$), is growing.

In FIG. 1b, the copper clad laminate 101 is drilled to form a via hole 104 for interlayer connection.

In FIG. 1c, electroless copper plating and electrolytic copper plating processes are conducted. In this regard, the electroless copper plating process is conducted before the electrolytic copper plating process. The reason that the electroless copper plating process is conducted before the electrolytic copper plating process is that the electrolytic copper plating process using electricity is not possible on the insulating layer. In other words, the electroless copper plating process is conducted as a pretreatment process to form a thin conductive film needed to conduct the electrolytic copper plating process. Since it is difficult to conduct the electroless copper plating process and to assure economic efficiency, it is preferable that a conductive part of a circuit pattern be formed using the electrolytic copper plating process.

Subsequently, a paste 106 is packed in the via hole 104 so as to protect electroless and electrolytic copper plating layers 105 formed on a wall of the via hole 104. The paste is generally made of an insulating ink material, but may be made of a conductive paste according to the intended use of the PCB. The conductive paste includes a mixture of any one metal, which is selected from Cu, Ag, Au, Sn, Pb, or an alloy thereof and acts as a main component, and an organic adhesive. However, the process of plugging the via hole 104 using the paste may be omitted according to the purpose of the MLB.

In FIG. 1c, for convenience of understanding, the electroless and electrolytic copper plating layers 105 are illustrated as one layer without distinguishing two layers from each other.

In FIG. 1d, an etching resist pattern 107 is constructed to form a circuit pattern for an internal circuit.

A circuit pattern, which is printed on an artwork film, must be transcribed on the substrate so as to form the resist pattern. The transcription may be conducted through various methods, but the most frequently used method is to transcribe a circuit pattern, which is printed on an artwork film, onto a photosensitive dry film using ultraviolet rays. Recently, a liquid photo resist (LPR) has sometimes been used instead of the dry film.

The dry film or LPR to which the circuit pattern is transferred acts as the etching resist 107, and when the substrate is dipped in an etching liquid as shown in FIG. 1e, the circuit pattern is formed.

After the formation of the circuit pattern, the appearance of the circuit pattern is observed using an automatic optical inspection (AOI) device so as to evaluate whether an internal circuit is correctly formed or not, and the resulting substrate is subjected to a surface treatment, such as a black oxide treatment.

The AOI device is used to automatically inspect the appearance of a PCB. The device automatically inspects the appearance of the PCB employing an image sensor and a pattern recognition technology using a computer. After reading information regarding the pattern of an objective circuit using the image sensor, the AOI device compares the information to reference data to evaluate whether defects have occurred or not.

The minimum value of an annular ring of a land (a portion of the PCB on which parts are to be mounted) and a ground state of a power source can be inspected by use of the AOI device. Furthermore, the width of the circuit pattern can be measured and the omission of a hole can be detected. However, it is impossible to inspect the internal state of a hole.

The black oxide treatment is conducted so as to improve adhesion strength and heat resistance before an internal layer having the circuit pattern is attached to an external layer.

In FIG. 1f, resin-coated copper (RCC) is applied to both sides of the resulting substrate. The RCC consists of a substrate in which a copper foil 109 is formed on only one side of a resin layer 108, and the resin layer 108 acts as an insulator between the circuit layers.

In FIG. 1g, a blind via hole 110 is formed to electrically connect the internal and external layers to each other. The blind via hole may be mechanically drilled. However, it is necessary to more precisely conduct the drilling in comparison with processing of a through hole, and thus, it is preferable to use an yttrium aluminum garnet (YAG) laser or a $CO_2$ laser. The YAG laser can drill both a copper foil and an insulating layer, but the $CO_2$ laser can drill only the insulating layer.

In FIG. 1h, an external layer 111 is laminated according to a plating process.

In FIG. 1i, the external layer 111 formed as shown in FIG. 1h is patterned according to the same procedure as the formation of the circuit pattern of the internal layer. The patterned external layer 111 is then inspected in terms of the circuit and subjected to a surface treatment, as in the case of the circuit pattern of the internal layer.

In FIG. 1j, additional RCC is applied to both sides of the resulting substrate. This RCC includes a resin layer 112 and a copper foil 113 coated on one side of the resin layer 112, and the resin layer 112 acts as an insulator.

In FIG. 1k, a blind via hole 114 is formed to electrically connect the external layers to each other using the laser as described above.

In FIG. 1l, the additional external layer 115 is laminated according to a plating process.

In FIG. 1m, the additional external layer 115 is patterned according to the same procedure as the external layer 111, and the circuits of the patterned external layer 115 are then inspected and the layer is subjected to a surface treatment.

The number of layers constituting the multilayer PCB may be continuously increased by repeating the lamination of layers, the construction of the circuit patterns, the inspection of the circuit patterns, and the surface treatment of the resulting structure.

Subsequently, a photo-solder resist and an Ni/Au layer are formed on the resulting circuit pattern, thereby creating a six-layered PCB.

In a conventional method of fabricating a substrate (PCB), an organic resin is used as an insulating layer to form a copper clad laminate (CCL) which is plated with Cu on both sides thereof. In this regard, the organic resin also acts as a backbone to support a product so as to keep its shape. Hence, it is necessary that a thickness of the product be 50 μm or more so as to keep the shape. In other words, when the thickness is the above limit or less, it is impossible to fabricate the product using a typical organic resin.

With respect to this, U.S. Pat. No. 6,696,764 discloses a method of fabricating two PCBs by cutting a central part of the PCB through a mechanical process after construction of the PCB. However, since the cutting is mechanically conducted, it has limited application to the fabrication of a precise PCB. Additionally, a core insulating layer remains after the cutting, making the PCB thick.

Accordingly, a more fundamental alternative proposal is needed to reduce a thickness of the PCB.

SUMMARY OF THE INVENTION

Therefore, the present invention has been made keeping in mind the above disadvantages occurring in the prior arts, and an object of the present invention is to provide a method of fabricating a slim PCB, in which a core insulating layer conventionally used is removed from a final product, thereby reducing the total thickness of the PCB.

The above object can be accomplished by providing a method of fabricating a PCB, which comprises preparing a base substrate which comprises a core insulating layer, release films attached to the core insulating layer, insulators laminated so as to surround the release films, and copper foils laminated on upper and lower sides of a resulting structure; forming solder resists on upper and lower sides of the base substrate; sequentially laminating circuit layers and insulating layers on upper and lower sides of the resulting base substrate; cutting edge portions of the resulting substrate so as to remove the edge portions which contain the insulators surrounding the release films; detaching the release films to divide the resulting substrate into two substrates so that the two substrates are separated from the core insulating layer; and removing the exposed copper foils from sides of the separated substrates.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
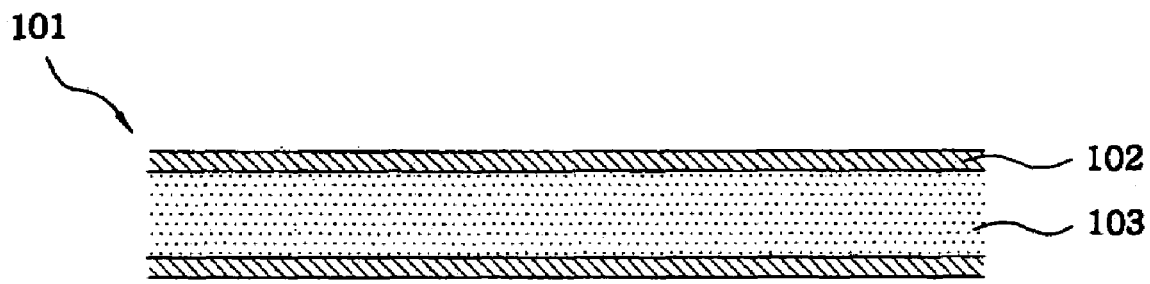
FIGS. 1a to 1m are sectional views stepwisely illustrating the fabrication of a six-layered PCB in the conventional build-up manner.
Figure 1B:
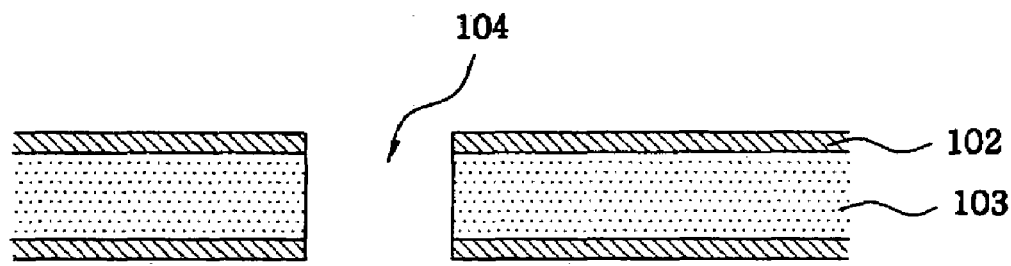
Figure 1C:
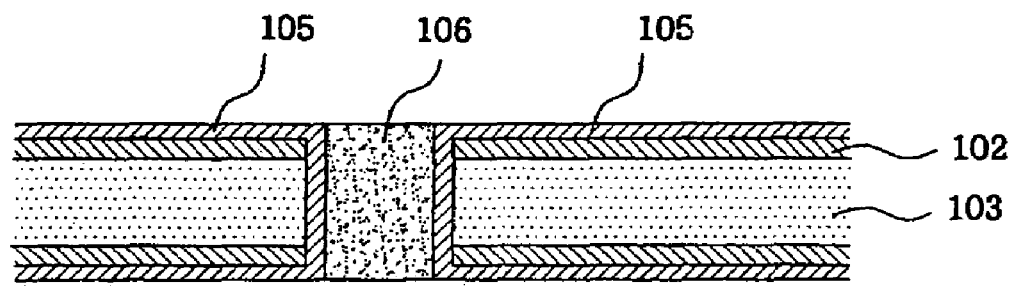
Figure 1D:
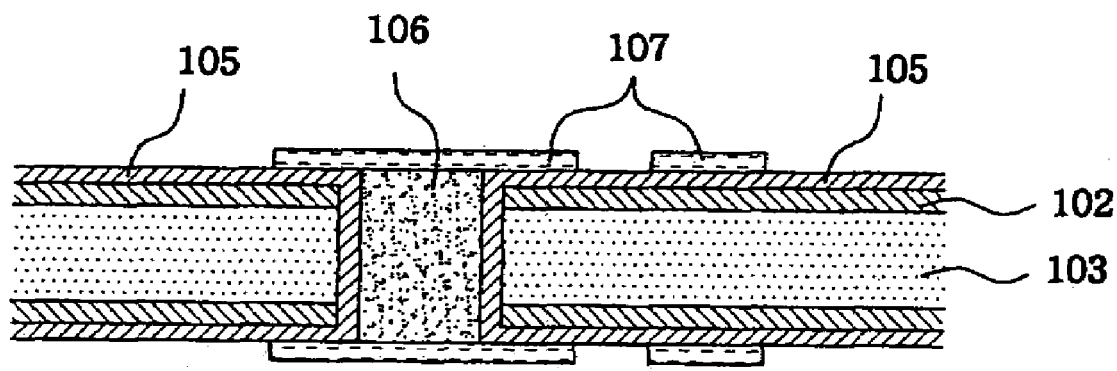
Figure 1E:
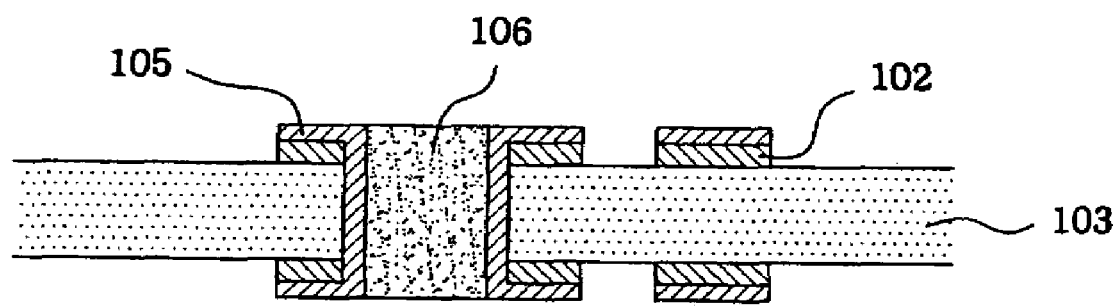
Figure 1F:
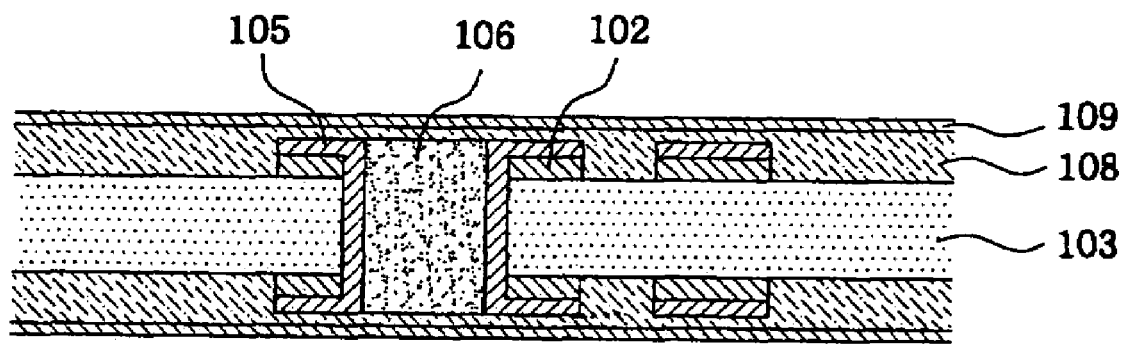
Figure 1G:
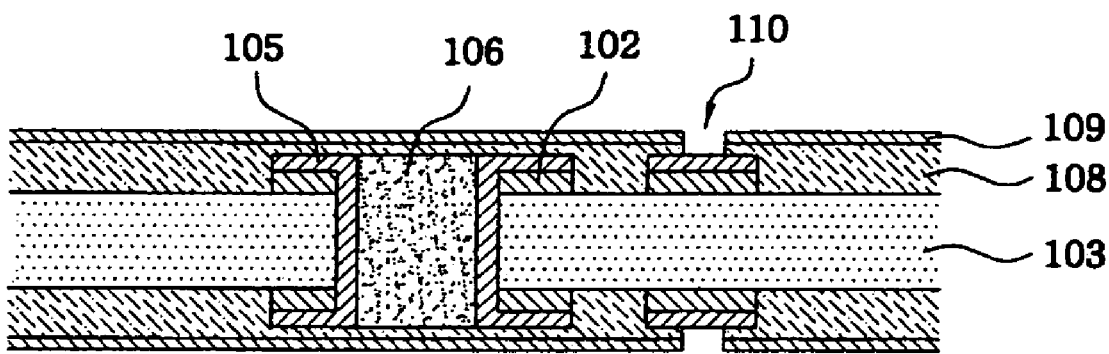
Figure 1H:
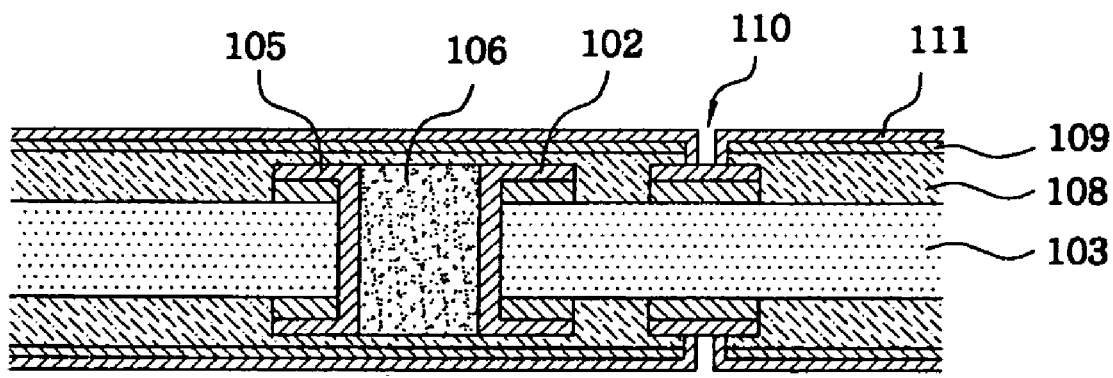
Figure 1I:
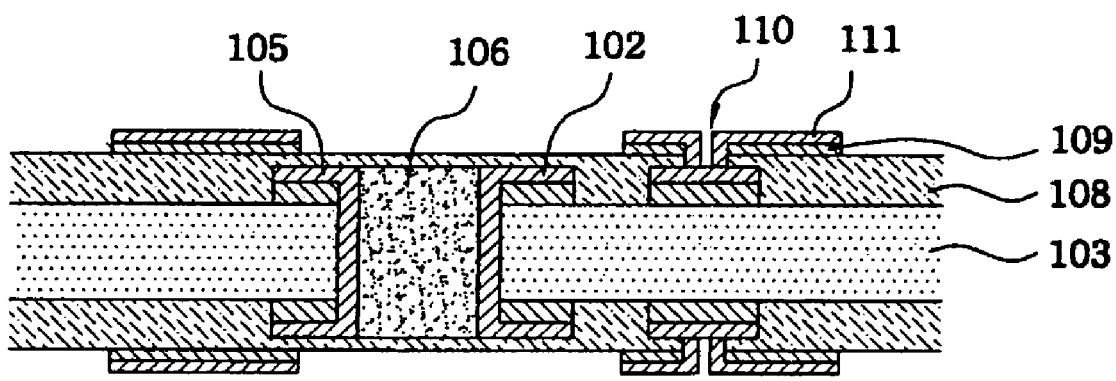
Figure 1J:
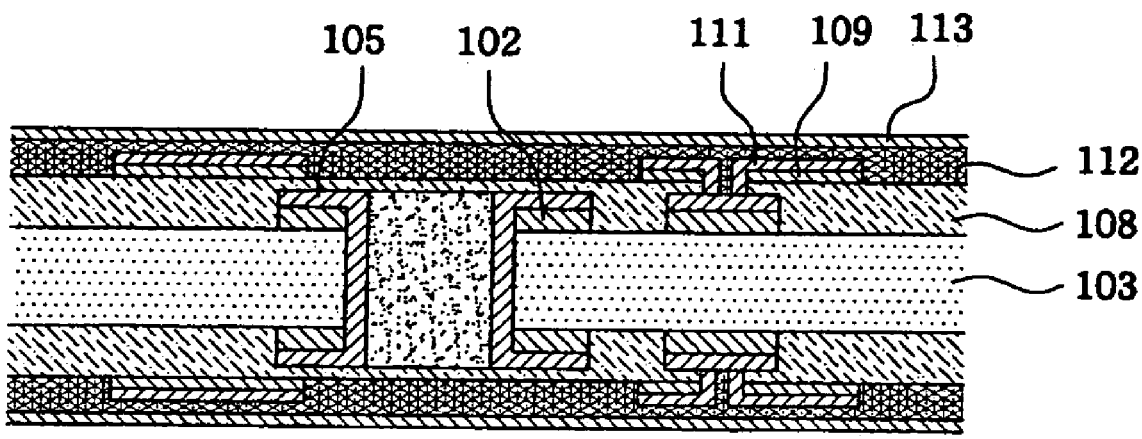
Figure 1K:
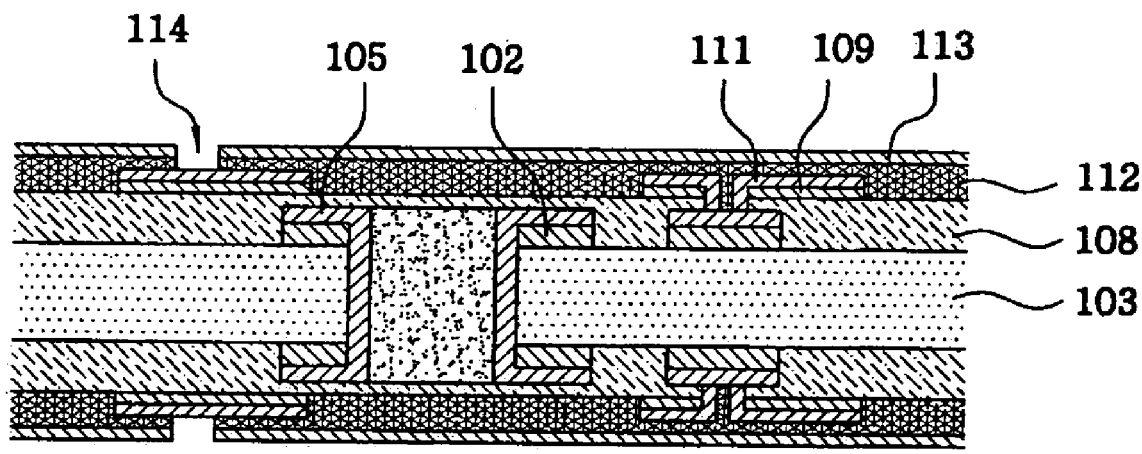
Figure 1L:
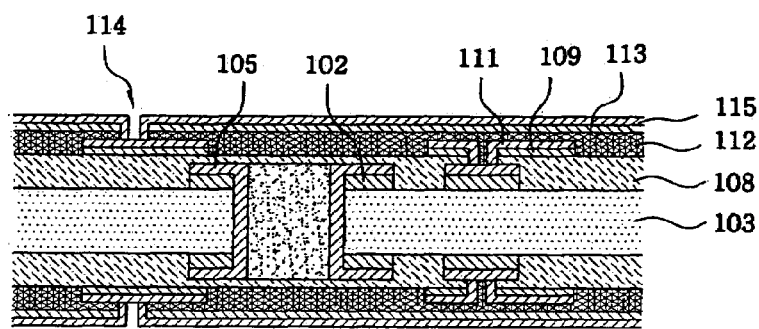
Figure 1M:
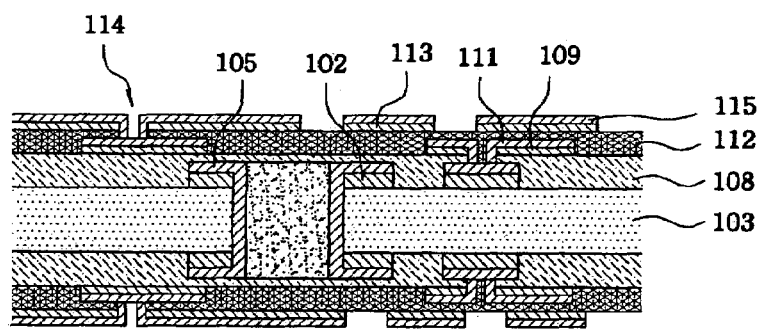
Figure 2A:
FIGS. 2a to 2n are sectional views stepwisely illustrating the fabrication of a PCB according to the present invention.
Figure 2B:
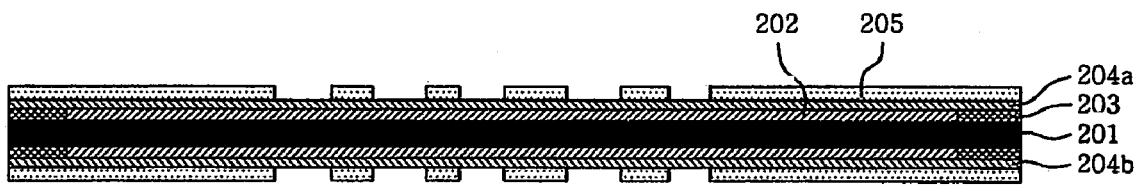
Figure 2C:
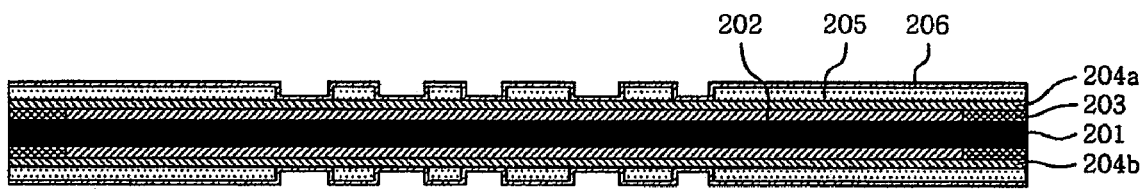
Figure 2D:
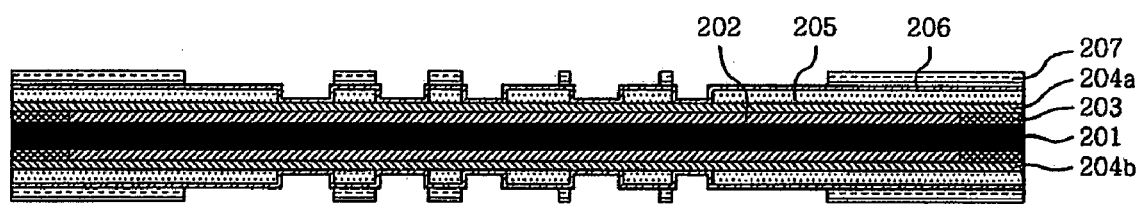
Figure 2E:
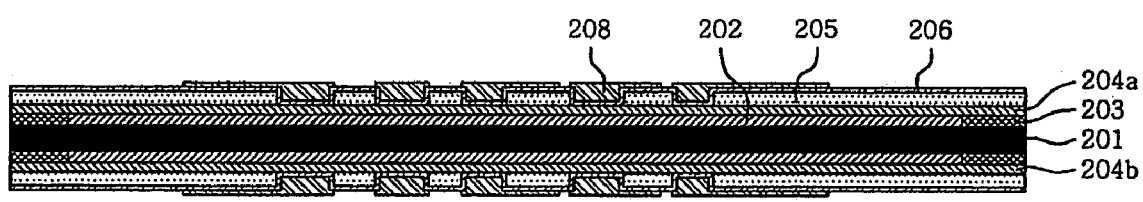
Figure 2F:
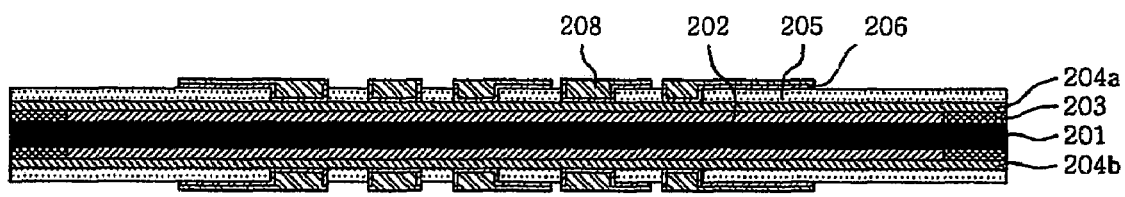
Figure 2G:
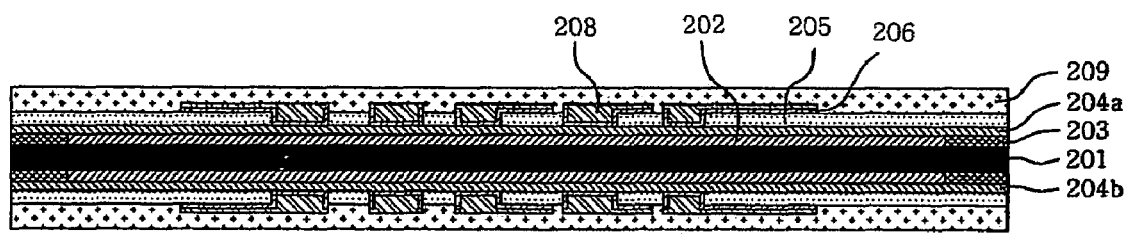
Figure 2H:
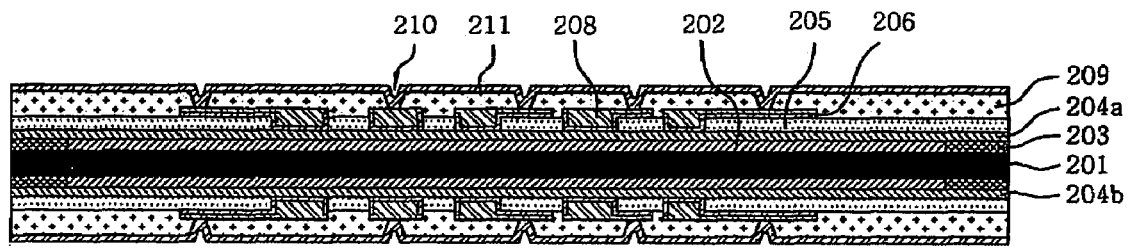
Figure 2I:
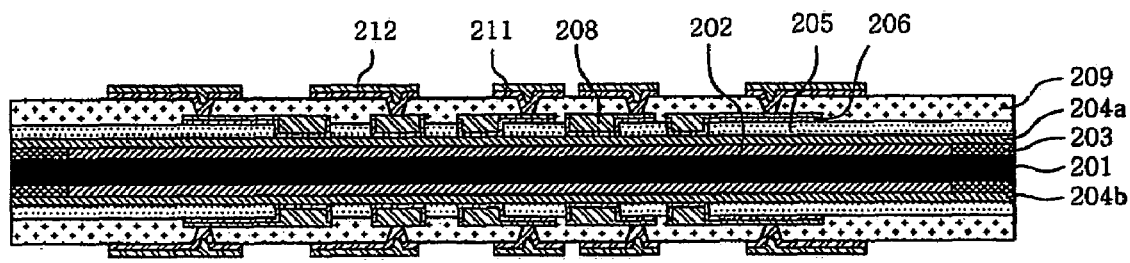
Figure 2J:
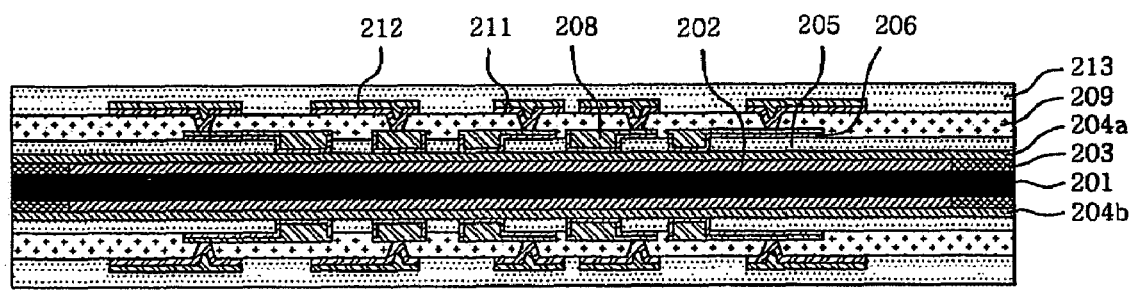
Figure 2K:
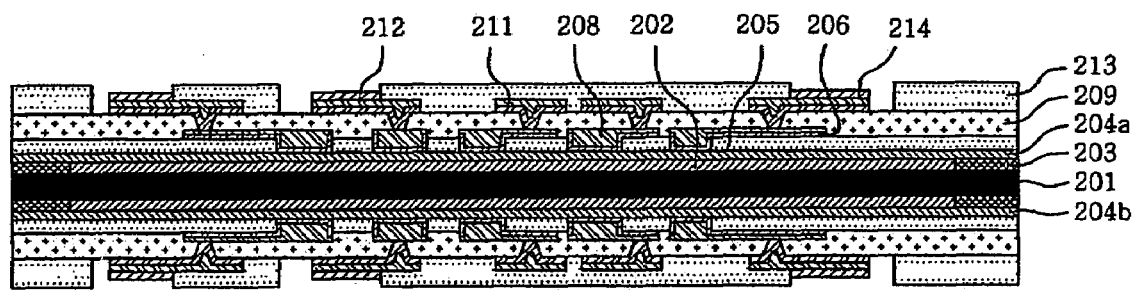
Figure 2L:
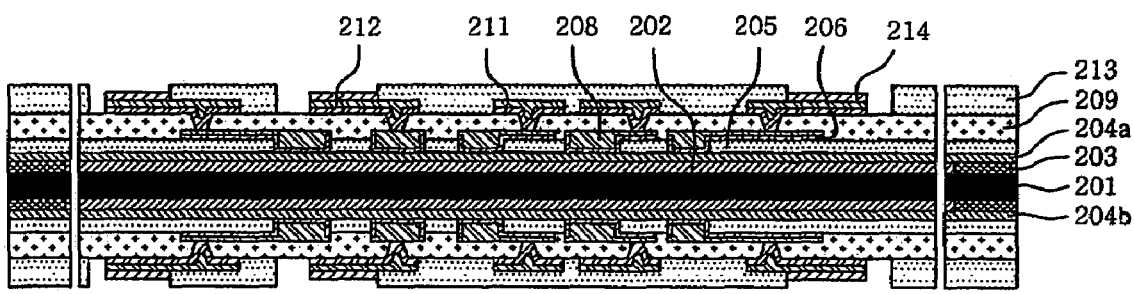
Figure 2M:
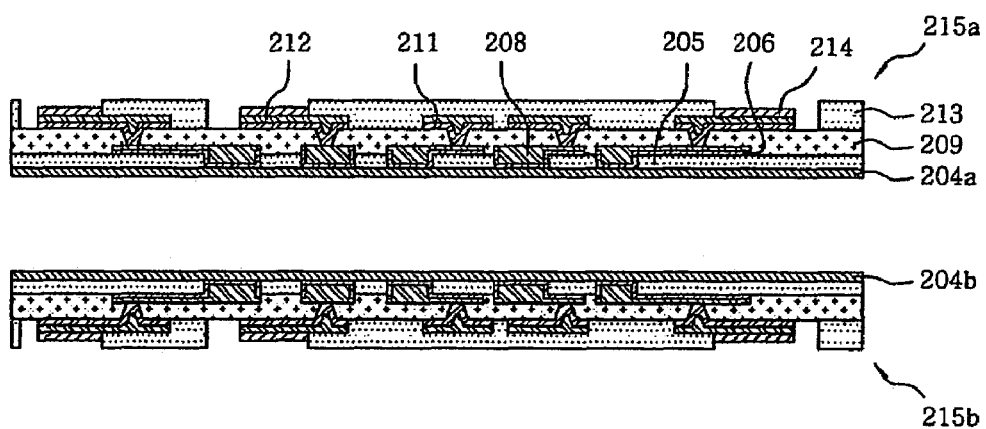
Figure 2N:
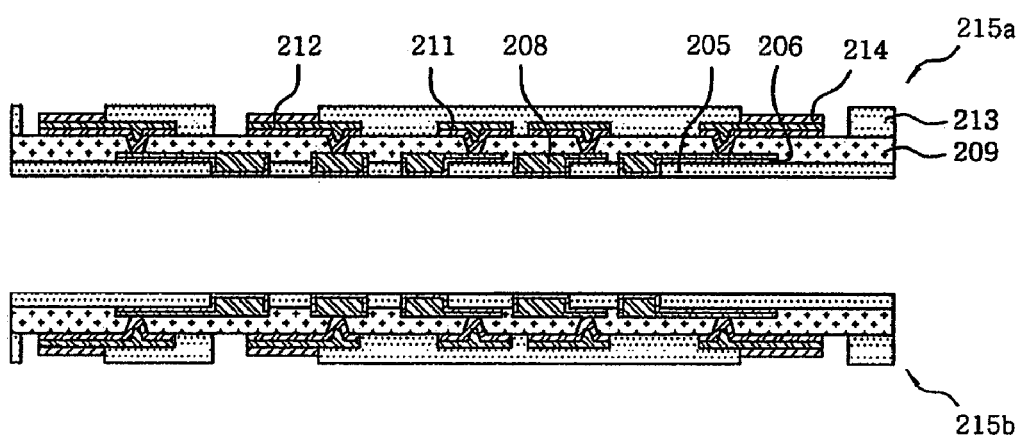

FIGS. 2a to 2n are sectional views stepwisely illustrating the fabrication of a PCB according to the present invention.

First, a base substrate 200 is formed as shown in FIG. 2a.

Release films 202 adhere to upper and lower sides of a core insulating layer 201, and insulators 203 are laminated so as to surround the release films 202. Subsequently, copper foils 204a, 204b are laminated to cover the release films 202 and the insulators 203. Proper pressure and heat are applied to upper and lower sides of the resulting substrate to press the resulting substrate.

An epoxy resin, which is incorporated in a glass fiber constituting the central layer of a conventional CCL, may be used as the core insulating layer 201. A prepreg, which is frequently used as an interlayer insulating material in the course of fabricating a conventional PCB, may be employed as the insulators 203.

The release films 202 are laminated on the core insulating layer 201, and the insulators 203 surround the release films. The copper foils 204a, 204b are laminated on the release films 202 and the insulators 203. A thickness of each of the copper foils 204a, 204b is about 10 μm.

The insulators 203 serve to physically support the copper foils 204a, 204b, thereby preventing the copper foils 204a, 204b from crumpling or tearing in the course of fabricating the PCB.

In FIG. 2b, a photosensitive solder resist 205 is applied, exposed and developed using a mask film, on which a predetermined circuit pattern is printed, to be patterned. During the exposure, a portion of the solder resist, which does not receive light because light is blocked by the mask film, is not transformed. However, the other portion of the solder resist, which receives light, is cured by light. Only the untransformed portion of the solder resist is removed to form the pattern. A photo solder resist may be used as the solder resist 205.

In FIG. 2c, an electroless copper plating process is conducted to form an electroless plating layer 206 which acts as a seed layer in an electrolytic copper plating process. It is possible to implement a sputtering process instead of the electroless plating process.

In FIG. 2d, a photosensitive plating resist 207 is applied, exposed and developed to be patterned using a predetermined mask pattern.

In FIG. 2e, after a circuit pattern 208 is formed by the electrolytic plating process, the plating resist 207 is stripped. The electroless plating layer 206 acts as a path through which a current flows during the electrolytic plating process. A thickness of the circuit pattern 208, which is formed through the electrolytic plating process, is about 7-15 μm. After the plating resist 207 is stripped, the electroless plating layer 206 having a thickness of about 0.3-0.5 μm, and the circuit pattern 208, which is formed through the electrolytic plating process and has a thickness of about 7-15 μm, remain.

In FIG. 2f, an exposed portion of the electroless plating layer 206 is removed through a flash etching process.

In FIG. 2g, an insulating layer 209 is laminated. An ink-type or sheet-type insulator may be used as the insulating layer 209. When using the ink-type insulator, an application process in a wet state, a curing process, and a brushing process are required. With respect to the sheet-type insulator, lamination and curing processes are enough. Accordingly, the sheet-type insulator is preferable in terms of workability and reliability. A prepreg may be used as the sheet-type insulator.

In FIG. 2h, the insulating layer 209 is drilled by a laser to form a via hole 210 therethrough so as to electrically connect upper and lower layers to each other. Next, an electroless plating process is implemented to form an electroless plating layer 211 for a seed layer on a wall of the via hole 210 and on a surface of the substrate.

In FIG. 2i, a plating resist is applied, exposed and developed to be patterned, and a circuit pattern 212 is formed through an electrolytic plating process. Subsequently, the plating resist is stripped, and a portion of the electroless plating layer 211, on which the circuit pattern 212 is not formed, is removed through a flash etching process.

In FIG. 2j, a solder resist 213, for example, a photo solder resist, is applied to the entire surface of the PCB.

In FIG. 2k, a portion of the solder resist 213, at which a connection pad of an external circuit is to be formed, is removed through exposure and development processes, and a plating process is conducted using Ni and Au to form an electrode pad 214 for electric connection to the external circuit.

In FIG. 2l, external portions of the PCB are cut to remove external portions of the core insulating layer which contain the insulators 203.

Next, as shown in FIG. 2m, the resulting double-sided PCB, which contains structures laminated on the release films 202, is divided into two PCBs 215a, 215b. An adsorption plate or a suction plate having a suction force is applied to both sides of the double-sided PCB and then pulled, thereby achieving the division. Since the release films are easily separated from the core insulating layer 201 and the copper foil layers 204a, 204b, it is possible to achieve the separation using low pressure while the PCB is not damaged. Accordingly, it is unnecessary to conduct cuffing for the separation.

A copper foil 204a, 204b remains on one side of each of the separated PCBs.

In FIG. 2n, the copper foil 204a, 204b is removed through an etching process, thereby creating the two PCBs which do not include the core insulating layer of a conventional CCL. The core insulating layer 201 is used to maintain physical strength in the course of fabricating the PCB, but is removed from the final product.

In a conventional PCB, a core insulating layer having a thickness of at least 60 μm or so is included in a final product. However, as shown in FIG. 2m, the insulating layer 209, such as a prepreg, is formed at the center of the PCB according to the present invention, and 30 μm or so is enough for a thickness of the insulating layer 209.

As described above, a method of fabricating a slim PCB according to the present invention is advantageous in that a core insulating layer conventionally used is removed from a final product, thereby reducing the total thickness of the PCB.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of fabricating a printed circuit board, comprising the steps of:

preparing a base substrate which comprises a core insulating layer, release films attached to the core insulating layer, insulators separately formed from the core insulating layer and laminated so as to surround the release film, to form a resulting structure; and copper foils laminated on upper and lower sides of the resulting structure;

maintaining the core insulating layer planar with the release film and the insulators;

forming the insulators to have the same thickness with that of the release film;

forming solder resists on upper and lower sides of the base substrate to form a resulting base substrate;

laminating circuit layers and insulating layers sequentially on upper and lower sides of the resulting base substrate to form a resulting substrate;

cutting edge portions of the resulting substrate so as to remove the edge portions which contain the insulators surrounding the release films;

detaching the release films to divide the resulting substrate into two substrates so the two substrates are separated from the core insulating layer; and removing the copper foils from the substrates.

2. The method as set forth in claim 1, wherein the step of laminating circuit layers and insulating layers sequentially comprises the steps of:

laminating the insulating layers for interlayer insulation on the upper and lower sides of the resulting base substrate;

forming via holes and circuit patterns on the insulating layers;

applying insulating solder resists; and forming electrode pads.

3. The method as set forth in claim 1, wherein the step of preparing the base substrate comprises the steps of:

attaching the release films to upper and lower sides of the core insulating layer;

laminating the insulators so as to surround the release films;

laminating the copper foils on upper and lower sides of the release films and the insulators; and pressing the base substrate.

* * * * *